United States Patent [19]

Cullet

[11] 4,347,479

[45] Aug. 31, 1982

[54] TEST METHODS AND STRUCTURES FOR SEMICONDUCTOR INTEGRATED CIRCUITS FOR ELECTRICALLY DETERMINING CERTAIN TOLERANCES DURING THE PHOTOLITHOGRAPHIC STEPS

[75] Inventor: Rene Cullet, Barbizon, France

[73] Assignee: International Business Machines Corporation, Armonk, N.Y.

[21] Appl. No.: 210,081

[22] Filed: Nov. 24, 1980

[30] Foreign Application Priority Data

Jan. 9, 1980 [FR] France .................................. 80 00751

[51] Int. Cl.³ ...................... G01R 27/14; G01R 31/00
[52] U.S. Cl. ................................... 324/64; 324/65 R; 324/158 R; 430/30
[58] Field of Search .................. 324/158 R, 62, 65 R, 324/64, 158 D; 29/574; 430/30

[56] References Cited

U.S. PATENT DOCUMENTS 3,922,707  11/1975  Freed et al. ..................... 324/158 R
3,974,443   8/1976  Thomas ................................. 324/64

OTHER PUBLICATIONS

T. H. Baker et al., "Dumbbell-Type Resistance Testing Structure", IBM Technical Disclosure Bulletin, vol. 14, No. 12, May 1972, p. 3707.
M. G. Buehler et al., "Bridge and Van der Pauw Sheet Resistors for Characterizing the Line Width of Conducting Layers", Journal of the Electrochemical Society, vol. 125, No. 4, Apr. 1978, pp. 650-654.
D. S. Perloff, "A Four-Point Electrical Measurement Technique for Characterizing Mask Superposition Errors on Semiconductor Wafers", IEEE Journal of Solid State Circuits, vol. SC-13, No. 4, Aug. 1978, pp. 436-444.

Primary Examiner—Ernest F. Karlsen
Attorney, Agent, or Firm—Paul C. Scifo

[57] ABSTRACT

Test methods and structures are provided for electrically monitoring the image size tolerance ($\Delta W$) during a critical photolithographic step in the processing of a semiconductor wafer. The test structure includes two symmetrical resistor bridges combined into a single structure exhibiting a specific topology and having specific nominal parameters of length and width. The structure further includes contact regions and contact voltages are respectively measured across the first and second bridges. The size tolerance is determined from the voltages. Therefore, the factor $\Delta W$ is directly determined by means of simple electrical measurements and, therefore, a data base is immediately provided with respect to the wafer in which the structure exists. Also, this invention relates to a method for monitoring the electrical tolerance ($\Delta A$) where images are superimposed, which uses the preceding calculation.

6 Claims, 5 Drawing Figures

TEST METHODS AND STRUCTURES FOR SEMICONDUCTOR INTEGRATED CIRCUITS FOR ELECTRICALLY DETERMINING CERTAIN TOLERANCES DURING THE PHOTOLITHOGRAPHIC STEPS

TECHNICAL FIELD

This invention relates to the testing and monitoring of semiconductor wafers. More specifically, this invention relates to methods and structures which are used for testing and monitoring and which allow certain characteristics, such as the image size and overlay tolerances, to be determined during photolithographic steps.

BACKGROUND ART

It is known that, of the numerous processing steps involved in the manufacture of semiconductor integrated circuits (e.g. diffusion, epitaxial growth, metallurgy, etc.), the lithographic steps are the most important, not only because they are frequently performed (some 10 masking steps are required for a MOSFET, while approximately 15 are used for a bipolar transistor), but also because they ultimately determine the density of the circuits. The efforts made to achieve an improved density have resulted in a significant development of lithographic techniques, which now involve electronbeam and x-ray exposures rather than the UV radiation exposures formerly used. Although finer and finer resolutions have thus been obtained (0.5 to 1 micron), the lithographic steps have become more critical. It is well known that the masking layers (or the masks) used in the manufacture of integrated circuits vary from the specifications established by the designer, as a result of undesirable effects such as overexposure or underexposure of the photoresist layers which may occur during fabrication of the masking layers or masks. Also, even if the width of the masking layer (or mask) is equivalent to the desired nominal width (W) of a line, any overetching or underetching of the insulating layer will result in the diffused regions being too wide or too narrow as compared with the nominal value. Lines exhibiting significant width variations ($\Delta W$) relative to the nominal (design) value (W) can pose reliability problems due to short circuits or to open circuits and must therefore be detected as early as possible during the manufacturing process.

Another important characteristic is that the diffused regions (resistors, lines, capacitors, etc.) formed through an insulating layer etched in accordance with a desired pattern and which may exhibit dimensional variations, can result in the components having incorrect ratings and thus create problems during operation.

It is therefore important to correct misalignments and other defects that will cause a shift in the position of the image. These shifts are expressed in terms of dimensional variations: instead of an etched area having a desired width W, there is obtained an etched area of which $\Delta W + W$ ($\Delta W$ being positive or negative). The relative tolerance is defined by the ratio $\Delta W/W$. Heretofore, this was determined visually, a time-consuming, costly process which did not yield meaningful data bases.

Also, it is often useful to know the overlay tolerance applicable to a couple of superimposed images. Usually, this tolerance is measured and checked visually, which entails the same disadvantages as those mentioned above.

SUMMARY OF THE INVENTION

A first object of the invention is to provide test methods and structures that allow image size tolerances to be directly determined by means of essentially electrical measurements.

Another object of the invention is to replace the visual inspection methods, which are time-consuming, costly and not very reliable, by a test method that can easily be implemented automatically and which permits statistical data bases to be readily developed, which are capable of yielding, if desired, wafer maps showing the good chips and the bad ones.

Another object of the invention is to provide test structures and a test method which permit the photolithographic steps that are essential to the manufacture of semiconductor devices and are often critical (particularly where small geometries are involved), to be monitored, both precisely and immediately, during the fabrication process.

Still another object of the invention is to provide test structures and a test method which, in combination with those already mentioned, allow the overlay or the alignment tolerance associated with two superimposed images to be determined by electric means.

Thus, the present invention relates to a test method and to test structures that include two integrated resistor bridges formed in a semiconductor substrate, typically made of silicon and which, when a current is applied across a first diagonal, permit the potential difference across the other diagonal to be measured, the potential differences associated with said bridges being designated $\Delta V1$ and $\Delta V2$, respectively. The sizes of the resistors are preferably selected so as to ensure that the dimensional tolerance will be a direct function of the measured voltages. Thus, in a preferred embodiment of the invention, the dimensional tolerance $\Delta W$ is related to the electrical values $\Delta V1$ and $\Delta V2$ by means of an expression such as $$\frac{\Delta W}{W} = \frac{2 \Delta V2}{\Delta V1 - \Delta V2}.$$

The subject invention also relates to the use of said test method and structures, in relation to another structure comprised of an integrated resistor (or resistor bridge), for measuring overlay tolerances $\Delta A$ when two images are superimposed.

The foregoing and other objects, features and advantages of the invention will be apparent from the following more particular description of a preferred embodiment of the invention, as illustrated in the accompanying drawings.

DESCRIPTION OF THE INVENTION

The subject invention initially proposes two resistor bridges for determining the image size variations that are due to the numerous lithographic steps performed during the processing of semiconductor chips.

The size of the resistors is selected so as to ensure that the tolerance being determined will be a direct function of the voltages actually measured.

Figure 1:
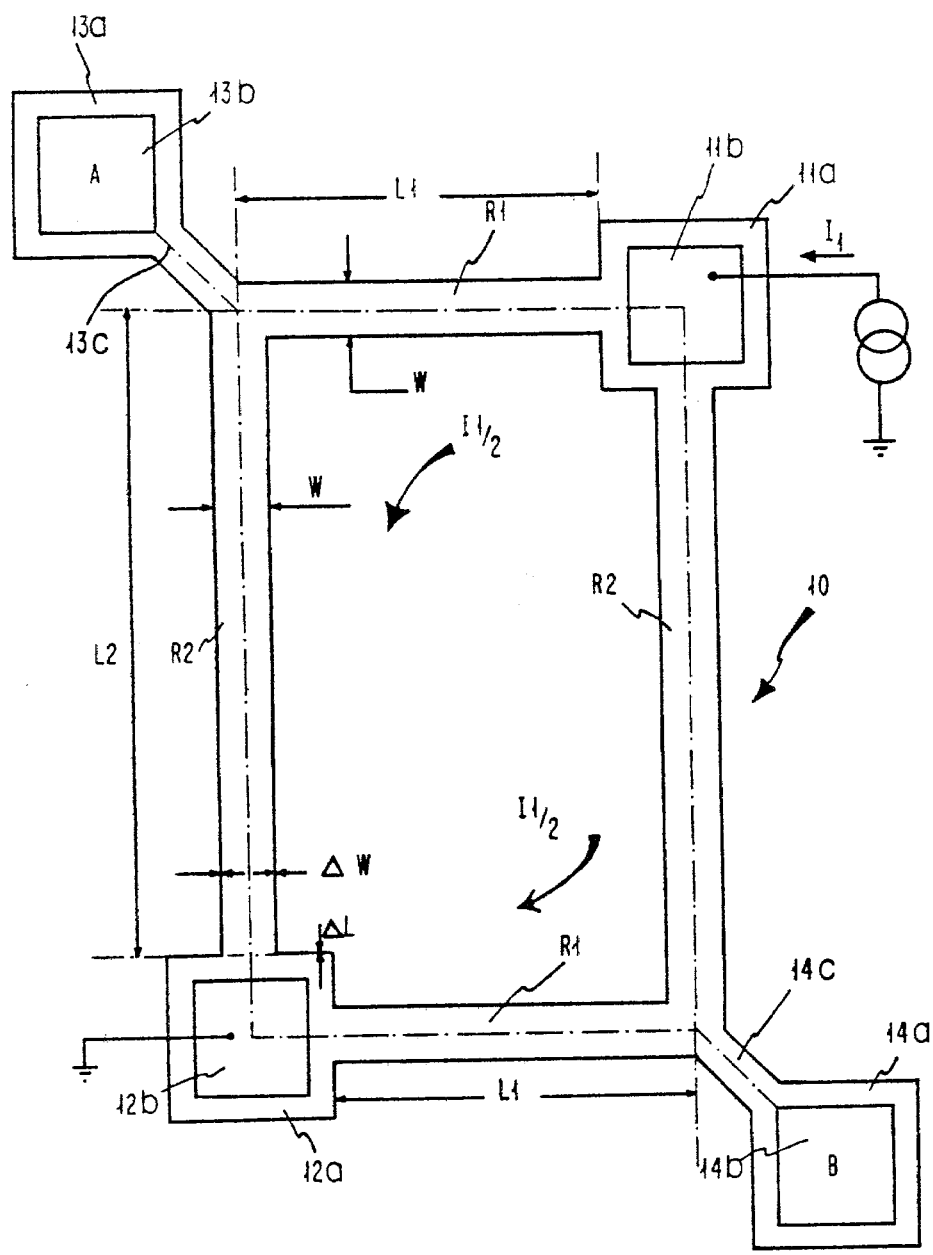
FIG. 1 shows the topology of a first resistor bridge forming part of an integrated structure formed in a silicon wafer for testing and monitoring the size tolerance.

FIG. 1 shows the topology of a first test structure consisting of a first resistor bridge 10. This figure illustrates the configuration of P-type resistors implanted or diffused in a N-type silicon substrate.

These resistors are formed by introducing impurities into a masking layer, typically $SiO_2$, in accordance with well-known techniques that need not be described here in detail. Alternatively, the illustrated resistors could have been deposited upon an insulating layer and etched. The resistors are made of a material exhibiting sufficient resistivity to allow the bridge unbalance to be measured, for example polycrystalline silicon or a metal. For simplicity, a symmetrical resistor bridge has been chosen.

The enlarged portions (or contact regions) that terminate the four resistors include two regions 11a and 12a located on a first diagonal, which regions are generally aligned with the resistors R1 and R2 and provided with contacts 11b and 12b consisting, for example, of aluminum. The illustrated contact configuration is preferred in order to ensure that the direction of current flow will be generally parallel to the resistors R1 and R2, and to reduce the end resistance effects ($R_{END}$). A current I1 and the ground potential will respectively be applied to these contacts. Two other regions, 13a and 14a, located on the second diagonal are also provided with contacts 13b and 14b, consisting, for example, of aluminum, which will be used to measure the potential difference across this bridge.

The contact regions 13a and 14a are preferably aligned with the second diagonal to reduce undesirable end resistance effects. The configuration of these contact regions should preferably be as shown to facilitate potential measurements (little current flows through the intermediate regions 13c and 14c). Accordingly, the test probes (not shown) should be pressed against the contacts 11b, 12, ..., to apply or to measure currents or potentials.

The resistors R1 and R2 have different lengths designated L1 and L2, respectively, but have the same width W. For the purposes of the lithographic step, the width tolerance (or error, or variation) is expressed as $\Delta W$.

As is known, the masks used to form the desired resistive pattern on the silicon wafer are generally comprised of a chromium layer deposited upon a glass plate and a photo resist layer and involve the use of conventional photolithographic techniques. Overexposure (or underexposure) of the photoresist layer to light will cause line width variations in the mask pattern relative to the width specified by the circuit designer. Also, overetching (or underetching) of the chromium will introduce additional variations. Finally, overetching (or underetching) of the mask will introduce variations in the masking layer. These will ultimately add up to the overall error $\Delta W$ relative to the nominal width W.

Knowing that the two branches of the bridge exhibit the same resistance, the following equations may be written:

$$V_A - V_B = (I_1/2)(R2 - R1)$$

Putting $$V_A - V_B = \Delta V_1$$

we get $$\Delta V_1 = (I_1/2)(R2 - R1) \quad (1)$$

We may also write $$R1 = \rho_s \left( \frac{L_1 + \Delta L_1}{W + \Delta W} \right) + R_{END}$$

and $$R2 = \rho_s \left( \frac{L_2 + \Delta L_2}{W + \Delta W} \right) + R_{END}$$

where $\rho_s$ is the sheet resistance of resistors R1 and R2: $\Delta L_1$, $\Delta L_2$ and $\Delta W$ are the tolerances with respect to lengths L1, L2 and to the width W (which is the same for both resistors); and $R_{END}$ is the end resistance between the resistor and the contact. $\Delta L_1$ is approximately equal to $\Delta L_2$, at least as a first approximation.

Calculating R1−R2 and using Eq. (1), we find $$\rho_s = \frac{2\Delta V_1}{I_1 (L_2 - L_1)} (W + \Delta W) \quad (2)$$

Figure 2:
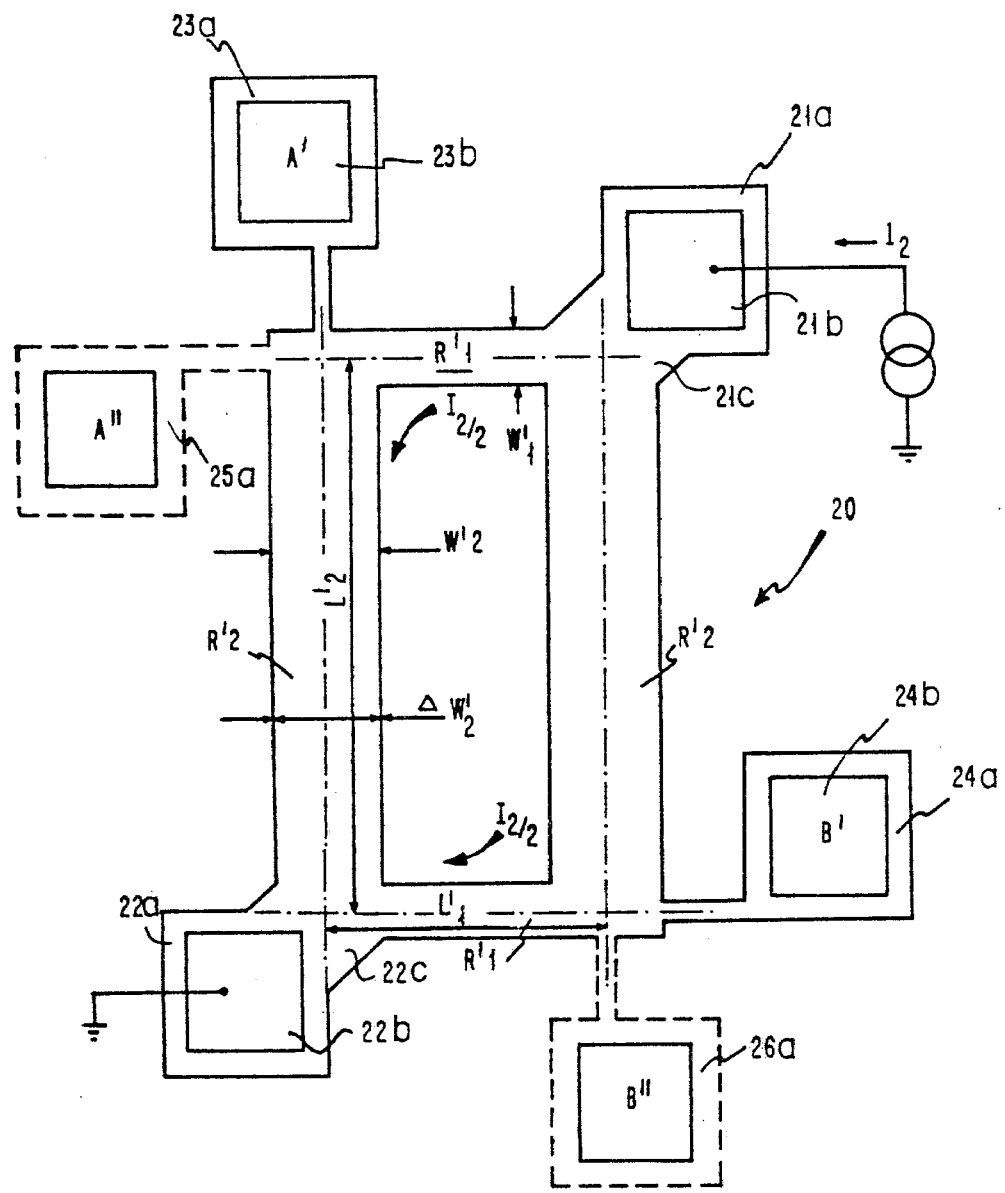
FIG. 2 shows the topology of a second resistor bridge constituting another part of the integrated structure formed in a silicon wafer for testing and monitoring the size tolerance.

This relation fails to provide the desired ratio $\Delta W/W$. To obtain this ratio, it is necessary to use a second test structure that is also comprised of a symmetrical resistor bridge 20, as shown in FIG. 2. The topology is fairly similar to that illustrated in FIG. 1. The structure includes two enlarged portions or contact regions 21a, 22a located on a first diagonal and provided with contacts 21b, 22b, made of aluminum, for example, to which a current $I_2$ and the ground potential are respectively applied. These contact regions preferably include an intermediate portion 21c, 22c, exhibiting the configuration shown for reducing the effects of length and width variations as well as the end resistance effects. The potentials present in regions 23a and 24a located on the other diagonal are similarly measured at terminals 23b and 24b. Additional regions 25a and 26a may be arranged symmetrically with regions 23a and 24a about the second diagonal in order to obtain a better approximation of the potential difference $\Delta V_2$ by calculating the average $$\Delta V_2 = \frac{(V_{A'} - V_{B'}) + (V_{A''} - V_{B''})}{2}$$

We may also write $$\Delta V_2 = (I_2/2)(R'_2 - R'_1) \quad (3)$$

For simplicity, we will put W'$_1$=W, L'$_2$=L$_2$ and L'$_1$=L$_1$.

Given this topology of the intermediate regions, we may assume that there is no error ΔL due to the etching operation and that the error ΔW is approximately equal to the error ΔW'$_2$, that is, ΔW'$_2$≈ΔW. Also, we may write $$R'_1 = \rho_s \frac{L_1}{W + \Delta W} + R_{END} = R_1$$

and $$R'_2 = \rho_s \frac{L_2}{W'_2 + \Delta W} + R_{END}$$

Calculating R'$_2$−R'$_1$ and combining with Eq. (3), we find $$\rho_s \left[ \frac{L_2}{W'_2 + \Delta W} - \frac{L_1}{W + \Delta W} \right] = 2 \frac{\Delta V_2}{I_2}$$

The above relation may also be written, since (L$_2$)/(W'$_2$)=(L$_1$/W)

$$2 \frac{\Delta V_2}{I_2} = \rho_s \frac{L_1}{W} \left[ \frac{1}{1 + \frac{\Delta W}{W'_2}} - \frac{1}{1 + \frac{\Delta W}{W}} \right]$$

$$2 \frac{\Delta V_2}{I_2} = \rho_s \frac{L_1}{W} \left[ \frac{W'_2(W + \Delta W) - W(W'_2 + \Delta W)}{(W'_2 + \Delta W)(W + \Delta W)} \right]$$

and substituting $\rho_s$ as given in Eq. (2), we get $$2 \frac{\Delta V_2}{I_2} = \frac{2 \Delta V_1}{I_2 (L_2 - L_1)} \cdot$$

$$\frac{(W + \Delta W) L_1}{W} \left[ \frac{W'_2(W + \Delta W) - W(W'_2 + \Delta W)}{(W'_2 + \Delta W)(W + \Delta W)} \right]$$

which simplified to $$\frac{\Delta V_2}{I_2} = \frac{\Delta V_1}{I_2} \cdot$$

$$\frac{L_1}{W(L_2 - L_1)} \left[ \frac{W'_2(W + \Delta W) - W(W'_2 + \Delta W)}{(W'_2 + \Delta W)} \right]$$

If we put $$(I_1/I_2) = K'$$

and if the designer requires that the following condition be satisified $$(L_2/L_1) = (W'_2/W) = K \quad (4)$$

we get $$\frac{\Delta V_2}{\Delta V_1} = \frac{1}{(K)'} \cdot \frac{1}{W} \cdot \frac{W}{K - 1} \left[ \frac{\Delta W(K - 1)}{(KW - \Delta W)} \right] =$$

-continued $$\frac{1}{K'} \cdot \frac{\Delta W}{(KW + \Delta W)}$$

hence $$\frac{\Delta W}{W} = \frac{K K'}{\frac{\Delta V_1}{\Delta V_2} - K'} \quad (5)$$

Thus, using the two test structures illustrated in FIGS. 1 and 2, the image size tolerance (ΔW/W) can be derived from simple electrical measurements.

Figure 3:
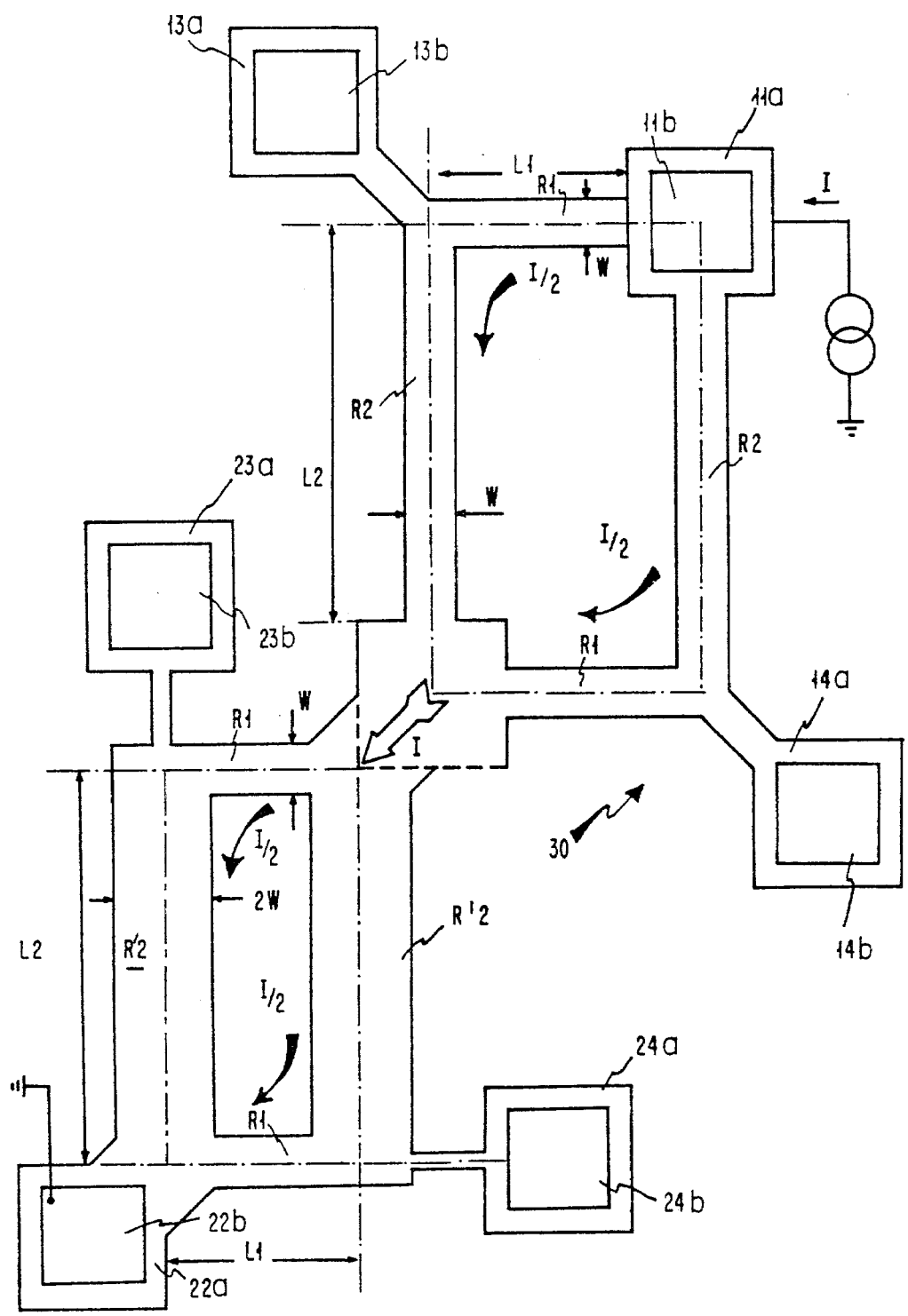
FIG. 3 depicts the topology of another test structure combining the two resistor bridges mentioned above.

The circuit designer can also use preferred values for the parameters K and K'. For example, if K'=1, i.e., I$_1$=I$_2$, the two structures can readily be combined to form a single structure 30 as shown in FIG. 3 (in which like reference numerals or characters designate like or corresponding components identified in FIGS. 1 and 2). Lastly, we chose K=2, i.e. W'$_2$=2W and L$_2$=2L$_1$. Therefore, Eq. (5) becomes $$m = \frac{\Delta W}{W} = \frac{2\Delta V_2}{\Delta V_1 - \Delta V_2} \quad (6)$$

with $$\Delta V_1 = V_A - V_B \text{ and } \Delta V_2 = V_A' - V_B'$$

This measurement (ΔW/W), in addition to being useful in determining the image tolerance (an important factor in evaluating the precision with which the etching process is performed), can serve to determine the image overlay tolerances.

The parameters of the various resistors that make up the bridges have been selected in such a way as to simplify the calculations and to permit determining ΔW as a function of ΔV$_1$ and ΔV$_2$. It should, however, be noted that the principles of the invention remain applicable to any other bridge structure, in which case ΔW would also be a function of said parameters (L$_1$, W$_1$, . . .).

Figure 4:
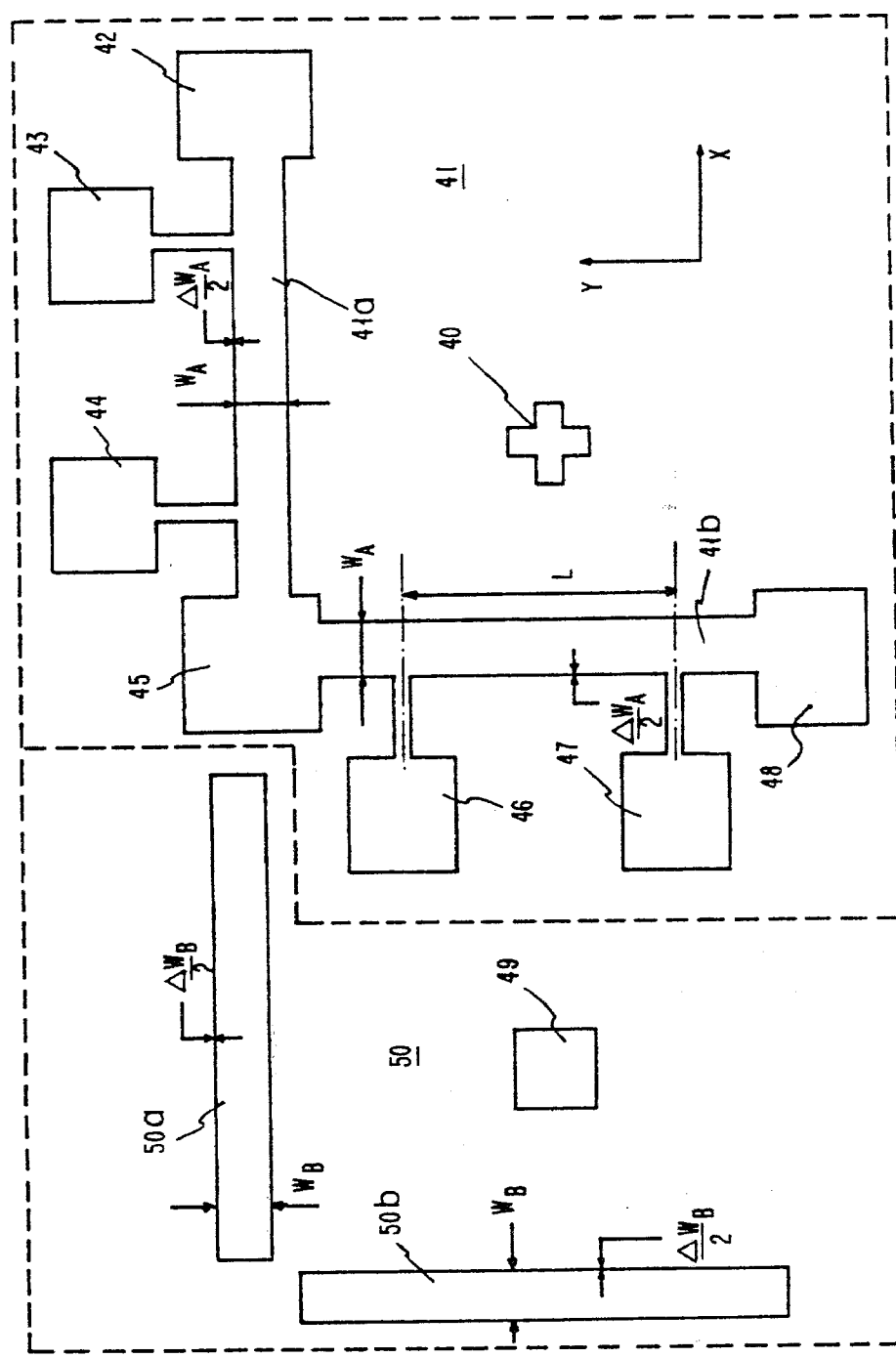
FIG. 4 shows the topology of a mask which is used for measuring the overlay tolerance and exhibits two distinct configurations for performing this measurement along two perpendicular axes.

FIG. 4 shows the topology of the mask corresponding to a test structure which allows the overlay tolerances to be electrically measured. This topology is characterized in that it includes a first Γ-shaped pattern 41 comprised of two regions 41a and 41b and seven enlarged areas or contact regions 42–48 that will enable electrical measurements to be subsequently taken. A mask registration region 40 is associated with this first pattern. The mask includes a second pattern 50 comprised of two distinct, Γ-shaped regions 50a and 50b and another registration region 49. Region 50a will be aligned with region 41a but slightly offset relative thereto along the Y-axis when patterns 41 and 50 are superimposed and registration regions 40 and 49 aligned. Similarly, region 50b will be aligned with region 41b but slightly offset relative thereto along the X-axis. Thus, the two patterns are necessary only if it is desired to determine the alignment tolerance along two axes. The silicon wafer, upon which an insulating layer (or a resistive layer made of metal or polysilicon) and a photoresist layer have previously been deposited, is successively exposed through patterns 41 and 50. This is done by simply translating the mask. The translation takes place within the dimensional limits of the semiconductor chip so as to eliminate mask skew and positioning errors. If it is desired to include the tolerances specific to the mask in the measurement, then two separate masks comprising patterns 50 and 41, respectively, must be used.

Figure 5:
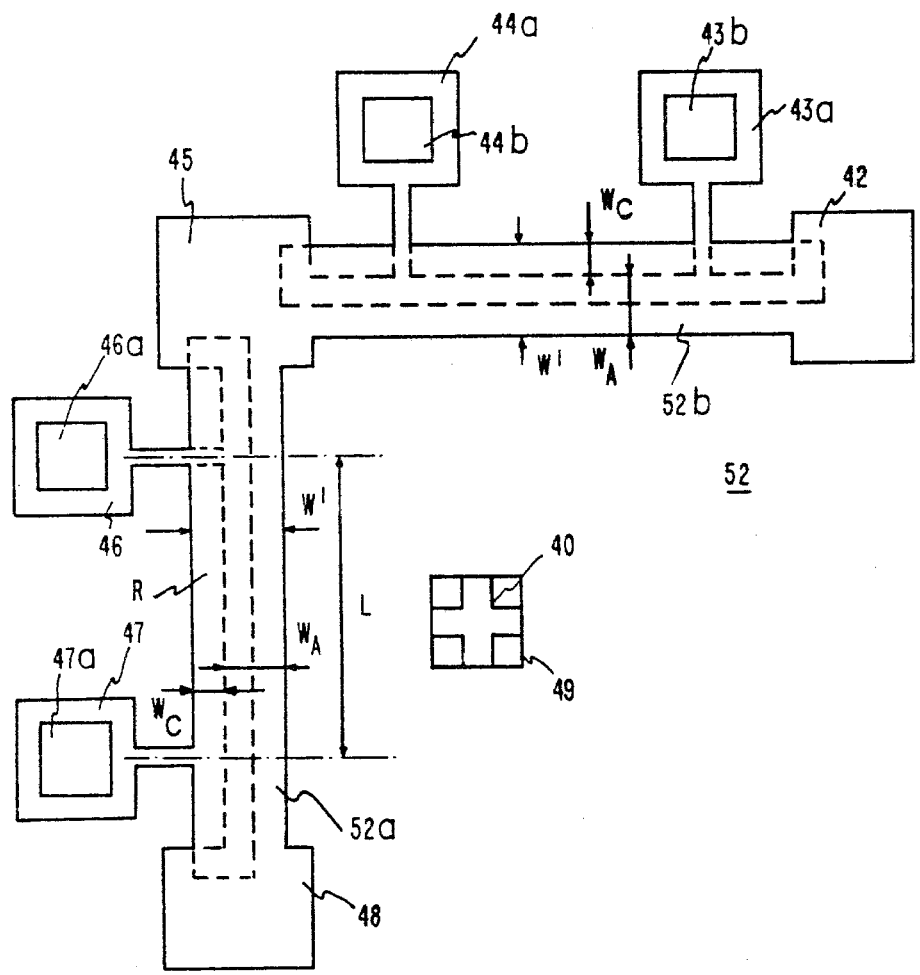
FIG. 5 illustrates an integrated test structure formed in a semiconductor wafer for measuring the overlay tolerance when the two configurations of FIG. 4 are superimposed.

The photoresist layer is then etched away by conventional means. The pattern finally obtained in the insulating layer corresponds to the superimposition of the two patterns. After an impurity has been introduced into the silicon substrate, a structure 52 is obtained which is comprised of two resistors 52a and 52b as shown in solid lines in FIG. 5. If a resistive layer were used, these resistors would be directly obtained by etching the resistive layer. Resistors 52a and 52b will serve to determine the alignment tolerances along the X-axis and the Y-axis, respectively.

The width of the resistors is dependent upon the dimensional tolerances associated with patterns 41 and 50, and also on the misalignment resulting from the superimposition of the two patterns. This misalignment is expressed as a so-called alignment or overlay tolerance $\Delta A$. When the image size tolerances are known, $\Delta A$ can be derived as follows: the final width W' is dependent on the image size tolerances with respect to patterns 41 ($\Delta W_A$) and 50 ($\Delta W_B$) and on the alignment tolerance ($\Delta A$), in accordance with the relation $$W' = W_A + W_C + \frac{\Delta W_A}{2} + \frac{\Delta W_B}{2} + \Delta A$$

($\Delta A$, $\Delta W_A$ and $\Delta W_B$ may be positive or negative).

Now, the dimensional errors applicable to patterns 41 and 50 ($\Delta W_A$ and $\Delta W_B$) are provided by the test structures described in connection with FIGS. 1-3. It is apparent that the above computation is valid since the test structures are adjacent on the silicon wafer, due to their being formed either on a specialized chip (test site) or on the edge of the chip itself (kerf).

According to Eq. (6), we have $$\Delta W_A = m_A W_A \text{ and } \Delta W_B = m_B W_B$$

$W_A$ and $W_C$ are very close to the widths specified by the circuit designer.

Accordingly, we find $$\Delta A = W' - \left[ (W_A + W_C) + \frac{m_A}{2} W_A + \frac{m_B}{2} W_B \right]$$

and, if we set $W_A + W_C = W_D$, $$\Delta A = W' - W_D - \frac{m_A}{2} W_A - \frac{m_B}{2} W_B$$

Using the metal contacts 46a, 47a provided on the enlarged regions 46, 47, we can measure the value of the resistances $$R = \rho_s(L)/(W'),$$

hence $$W' = \rho_s(L/R)$$

and $$\Delta A = \rho_s \frac{L}{R} - W_D - \frac{m_A}{2} W_A - \frac{m_B}{2} W_B \quad (7)$$

where
$m_A$ and $m_B$ characterize the dimensional errors,
$\rho_s$ is the sheet resistance exhibited by the implanted or diffused region,
$W_A$, $W_C$ denote design widths, (hence $W_D$)
L denotes a design length.

Thus, the alignment error can be immediately obtained through a simple resistance measurement and an elementary calculation.

Lastly, to achieve a higher degree of precision, and assuming that the number of test points is not a limiting factor, the resistors 52a and 52b may be replaced by resistor bridges which may be given different orientations depending on whether the misalignment is measured along the X-axis or the Y-axis.

While the invention has been particularly shown and described with reference to a preferred embodiment thereof, it will be understood by those skilled in the art that numerous changes in form and detail may be made therein without departing from the spirit and scope of the invention.

What is claimed is:

1. A test structure formed in a semiconductor wafer, the wafer including semiconductor devices therein having lines made by lithographic process steps, the test structure formed in the wafer for electrically monitoring the variations in line width relative to nominal line width ($\Delta W/W$), the structure comprising:

a first resistance bridge having a first branch including at least two resistive elements, each element having a resistance value defined by the length, width and resistivity of the element and a second branch including at least two resistive elements, each element having a resistance value defined by the length, width and resistivity of the element, the first branch electrically connected in parallel with the second branch and of a resistance value approximately equal to that of the second branch, the first branch further including means for monitoring a voltage across one resistive element in the first branch and the second branch further including means for monitoring voltage across one resistive element in the second branch so that when a current is applied to the bridge, a voltage difference ($\Delta V_1$) between the two branches can be measured, and a second resistive bridge having a first branch including at least two resistive elements, each element having a resistance value defined by the length, width and resistivity of the element and a second branch including at least two resistive elements, each element having a resistance value defined by the length, width and resistivity of the element, the first branch electrically connected and parallel with the second branch and of a resistance value approximately equal to the second branch, the first branch including means for monitoring a voltage at one resistive element of the first branch and means for monitoring the voltage at one resistive element of the second branch so that the voltage difference between the two elements ($\Delta V_2$) can be monitored when a current is applied to the second bridge whereby variation in line width relative to nominal line width ($\Delta W/W$) for lines fabricated in and on the wafer may be directly monitored by measuring the voltage difference ($\Delta V_1$) between the first and second branches of the first bridge and the voltage difference ($\Delta V_2$) between the first and second branches of the second bridge.

2. The test structure of claim 1 wherein the first bridge is electrically connected in series with the second bridge.

3. The test structure of claim 2 wherein the width of the voltage monitored resistive elements of the first branch of the first and second bridges respectively are equal to the respective width of the voltage monitored elements of the second branch of the first and second bridges, but wherein the lengths of the voltage monitored resistive elements of the first branch of the first and second bridge respectively are not equal to the respective lengths of the voltage monitored resistive element of the second branch of the first and second bridges.

4. The test structure of claim 2 wherein the width of the voltage monitored resistive element of the first branch of the first bridge is equal to the width of the voltage monitored element of the second branch of the first bridge and equal to the width of the voltage monitored element of the first branch of the second bridge, but where the width of the voltage monitored element of the second branch of the second bridge is equal to twice the width of the voltage monitored element of the first branch of the second bridge and where the length of the voltage monitored element of the first branch of the first bridge is equal to the length of the voltage monitored element of the first branch of the second bridge and the length of the voltage monitored element of the second branch of the first bridge is equal to the length of the voltage monitored element of the second branch of the second bridge which itself is equal to twice the length of the voltage monitored element of the first branch of the second bridge and where the current supplied to the first bridge and the second bridge is equal so that the variation of line width relative to nominal line width ($\Delta W/W$) is determined by monitoring the voltage measured at the first bridge ($\Delta V_1$) and the second bridge ($\Delta V_2$) according to the following relationship:

$$\frac{\Delta W}{W} = \frac{2\Delta V_2}{\Delta V_1 - \Delta V_2}.$$

5. The test structure of claim 3 or 4 wherein the first and second bridges are provided with contact regions for making electrical connections which minimize end resistance effects.

6. A structure according to claim 5, wherein the test structure is located either on the periphery of the chip (Kerf) or in a specialized chip (test site).

* * * * *